United States Patent
Lee et al.

(10) Patent No.: US 10,559,550 B2
(45) Date of Patent: Feb. 11, 2020

(54) MEMORY DEVICE INCLUDING HETEROGENEOUS VOLATILE MEMORY CHIPS AND ELECTRONIC DEVICE INCLUDING THE SAME

(71) Applicant: SAMSUNG ELECTRONICS CO., LTD., Suwin-si, Gyeonggi-do (KR)

(72) Inventors: Jungbae Lee, Seongnam-si (KR); Kwanghyun Kim, Seongnam-si (KR); Sang-Kyu Kang, Anyang-si (KR); Do Kyun Kim, Seongnam-si (KR); DongMin Kim, Suwon-si (KR); Ji Hyun Ahn, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/055,199

(22) Filed: Aug. 6, 2018

(65) Prior Publication Data
US 2019/0206840 A1 Jul. 4, 2019

(30) Foreign Application Priority Data
Dec. 28, 2017 (KR) .......................... 10-2017-0182041

(51) Int. Cl.
| | |
|---|---|
| *G11C 5/04* | (2006.01) |
| *H01L 25/065* | (2006.01) |
| *G11C 11/4076* | (2006.01) |
| *H01L 23/538* | (2006.01) |
| *H01L 27/108* | (2006.01) |
| *G11C 7/10* | (2006.01) |
| *G11C 11/4093* | (2006.01) |
| *G11C 11/406* | (2006.01) |

(52) U.S. Cl.
CPC ............ *H01L 25/0657* (2013.01); *G11C 5/04* (2013.01); *G11C 7/1057* (2013.01); *G11C 7/1084* (2013.01); *G11C 11/4076* (2013.01); *G11C 11/4093* (2013.01); *H01L 23/5386* (2013.01); *H01L 27/10805* (2013.01); *G11C 7/1045* (2013.01); *G11C 11/40615* (2013.01); *G11C 2207/22* (2013.01)

(58) Field of Classification Search
CPC ........... H01L 25/0657; H01L 27/10805; H01L 23/5386; G11C 11/4076; G06F 3/0634; G06F 3/0613
See application file for complete search history.

(56) References Cited

U.S. PATENT DOCUMENTS

| | | |
|---|---|---|
| 5,112,773 A | 5/1992 | Tuttle |
| 5,677,219 A | 10/1997 | Mazure et al. |
| 5,812,792 A | 9/1998 | Haddock et al. |
| 5,867,443 A | 2/1999 | Linderman |
| 6,530,007 B2 | 3/2003 | Olarig et al. |
| 6,839,260 B2 | 1/2005 | Ishii |
| 6,904,053 B1 | 6/2005 | Berman |

(Continued)

*Primary Examiner* — David Lam
(74) *Attorney, Agent, or Firm* — Volentine, Whitt & Francos, PLLC

(57) ABSTRACT

A memory device includes a first volatile memory chip that includes a first volatile memory cell array storing first data and that receives or outputs the first data at a first bandwidth, and a second volatile memory chip that includes a second volatile memory cell array storing second data and that receives or outputs the second data at a second bandwidth different from the first bandwidth.

17 Claims, 9 Drawing Sheets

(56) References Cited

U.S. PATENT DOCUMENTS

| | | |
|---|---|---|
| 7,325,239 B2 | 1/2008 | Hariharan et al. |
| 7,487,341 B2 | 2/2009 | Wang et al. |
| 7,515,453 B2 | 4/2009 | Rajan |
| 7,609,297 B2 | 10/2009 | Master et al. |
| 7,685,376 B2 | 3/2010 | Zimmer et al. |
| 7,647,476 B2 | 6/2010 | Mozak et al. |
| 7,930,661 B1 | 4/2011 | Trimberger et al. |
| 8,281,060 B2 | 10/2012 | Supalov et al. |
| 8,307,014 B2 | 11/2012 | Mehrotra et al. |
| 8,327,104 B2 | 12/2012 | Smith et al. |
| 8,397,013 B1 | 3/2013 | Rosenband et al. |
| 8,473,762 B2 | 6/2013 | Dennard et al. |
| 8,495,330 B2 | 7/2013 | Vergis et al. |
| 8,843,728 B2 | 9/2014 | Wang et al. |
| 8,990,538 B2 | 3/2015 | Worthington et al. |
| 9,043,557 B1 | 5/2015 | Sundararajan et al. |
| 9,071,246 B2 | 6/2015 | Subramaniam et al. |
| 9,110,592 B2 | 8/2015 | Lee et al. |
| 9,147,438 B2 | 9/2015 | Kamal et al. |
| 9,218,854 B2 | 12/2015 | Stephens, Jr. |
| 9,224,452 B2 | 12/2015 | Dong et al. |
| 9,240,452 B2 | 1/2016 | Kusaba et al. |
| 9,251,955 B2 | 2/2016 | Doi et al. |
| 9,252,081 B2 | 2/2016 | Ide |
| 9,262,325 B1 | 2/2016 | Sundararajan et al. |
| 9,268,681 B2 | 2/2016 | Fai |
| 9,286,221 B1 | 3/2016 | Sundararajan et al. |
| 9,342,122 B2 | 5/2016 | Schuessler et al. |
| 9,360,927 B2 | 6/2016 | Herdrich et al. |
| 9,391,453 B2 | 7/2016 | Droege et al. |
| 9,459,874 B2 | 10/2016 | Wang et al. |
| 9,472,248 B2 | 10/2016 | Wilkerson et al. |
| 9,606,916 B2 * | 3/2017 | Lee .................... G06F 12/0607 |
| 9,626,307 B2 | 4/2017 | Kim |
| 9,665,677 B2 | 5/2017 | Subramanian et al. |
| 9,697,111 B2 | 7/2017 | Yoo et al. |
| 2008/0106958 A1 | 5/2008 | Kwon et al. |
| 2009/0254705 A1 | 10/2009 | Abali et al. |
| 2010/0153934 A1 | 6/2010 | Lachner |
| 2012/0324156 A1 | 12/2012 | Muralimanohar et al. |
| 2013/0039112 A1 * | 2/2013 | Riho .................... G11C 5/02 365/63 |
| 2013/0046934 A1 | 2/2013 | Nychka et al. |
| 2013/0322556 A1 | 12/2013 | Thomas et al. |
| 2013/0329491 A1 | 12/2013 | Chang et al. |
| 2014/0082630 A1 | 3/2014 | Ginzburg et al. |
| 2014/0098613 A1 | 4/2014 | Kim |
| 2014/0115596 A1 | 4/2014 | Khan et al. |
| 2014/0129808 A1 | 5/2014 | Naveh et al. |
| 2014/0215177 A1 | 7/2014 | Kim et al. |
| 2014/0240327 A1 | 8/2014 | Lustig et al. |
| 2014/0281204 A1 | 9/2014 | Jeddeloh et al. |
| 2014/0310490 A1 | 10/2014 | Vogt |
| 2015/0007196 A1 | 1/2015 | Toll et al. |
| 2015/0067234 A1 | 3/2015 | Shin et al. |
| 2015/0286565 A1 | 10/2015 | De et al. |
| 2016/0004660 A1 | 1/2016 | Lee |
| 2016/0035711 A1 | 2/2016 | Hu |
| 2016/0054947 A1 * | 2/2016 | Liu .................... G06F 3/0634 711/170 |
| 2016/0055097 A1 | 2/2016 | Ki et al. |
| 2016/0132265 A1 | 5/2016 | Yi et al. |
| 2016/0154677 A1 | 6/2016 | Barik et al. |
| 2016/0239074 A1 | 8/2016 | Lee et al. |
| 2016/0283429 A1 | 9/2016 | Wagh et al. |
| 2016/0299559 A1 | 10/2016 | Herdrich et al. |
| 2016/0320994 A1 | 11/2016 | Chun et al. |
| 2016/0342343 A1 * | 11/2016 | Yen .................... G06F 12/10 |
| 2016/0364346 A1 | 12/2016 | Yang et al. |
| 2016/0371187 A1 | 12/2016 | Roberts |
| 2017/0017580 A1 | 1/2017 | Wilkerson et al. |
| 2017/0083475 A1 | 3/2017 | Wu et al. |
| 2017/0091287 A1 | 3/2017 | Wang et al. |
| 2017/0109213 A1 | 4/2017 | Barik et al. |
| 2017/0160955 A1 | 6/2017 | Jayasena et al. |

* cited by examiner

MEMORY DEVICE INCLUDING HETEROGENEOUS VOLATILE MEMORY CHIPS AND ELECTRONIC DEVICE INCLUDING THE SAME

CROSS-REFERENCE TO RELATED APPLICATIONS

A claim for priority under 35 U.S.C. § 119 is made to Korean Patent Application No. 10-2017-0182041 filed on Dec. 28, 2017, in the Korean Intellectual Property Office, the entire contents of which are incorporated herein by reference.

BACKGROUND

The inventive concepts described herein relate to a memory device and an electronic device including the same, and more particularly to a memory device including heterogeneous volatile memory chips and an electronic device including the same.

An application processor (AP) may be implemented in the form of a system on chip (hereinafter referred to as a "SoC"). The SoC may refer to one chip in which various systems are integrated. The SoC may include a processor for executing a program according to an application. The SoC may include a memory device that communicates with the processor and that stores a program to be executed by the processor, a processed result, or the like.

The memory device may be, for example, a dynamic random access memory (DRAM) and may operate as a main memory of the SoC. Characteristics of the memory device, such as capacity, bandwidth, and power consumption, may be associated with applications that the SoC supports. As the SoC supports various applications, there may be a need for a memory device suitable to execute the various applications.

SUMMARY

Embodiments of the inventive concepts provide a memory device including heterogeneous volatile memory chips and an electronic device including the same.

Embodiments of the inventive concepts provide a memory device including a first volatile memory chip that includes a first volatile memory cell array storing first data and that receives or outputs the first data at a first bandwidth; and a second volatile memory chip that includes a second volatile memory cell array storing second data and that receives or outputs the second data at a second bandwidth different from the first bandwidth.

Embodiments of the inventive concepts provide a memory device including a first volatile memory die that includes a first volatile memory cell array storing first data, and first through silicon vias for input/output of the first data; a second volatile memory die that includes a second volatile memory cell array storing second data, and second through silicon vias for input/output of the second data; and a buffer die that receives the first data through the first through silicon vias and outputs the first data at a first bandwidth, and receives the second data through the second through silicon vias and outputs the second data at a second bandwidth different from the first bandwidth.

Embodiments of the inventive concepts provide an electronic device including a system on chip that includes a first processor and a second processor; and a memory device that includes a first volatile memory chip communicating with the first processor through a first channel, and a second volatile memory chip communicating with the second processor through a second channel. A first bandwidth of the first channel and a second bandwidth of the second channel are different from each other.

BRIEF DESCRIPTION OF THE FIGURES

The above and other objects and features of the inventive concepts will become apparent in view of the following detailed description of exemplary embodiments provided with reference to the accompanying drawings.

DETAILED DESCRIPTION

Below, embodiments of the inventive concepts are described in detail and clearly to such an extent that one of ordinary skill in the art may implement the inventive concepts.

Figure 1:
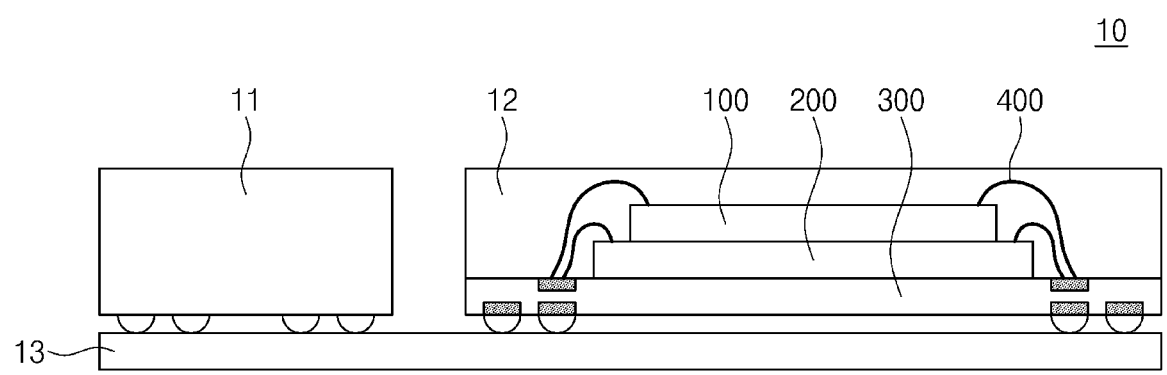
FIG. 1 illustrates a diagram of an electronic device according to an embodiment of the inventive concepts.

FIG. 1 illustrates a diagram of an electronic device, according to an embodiment of the inventive concepts. Referring to FIG. 1, an electronic device 10 includes a system on chip (hereinafter referred to as a "SoC") 11, a memory device 12, and a substrate 13.

The SoC 11 may control overall operations of the electronic device 10 as an application processor (AP) for example. The SoC 11 may execute a program depending an application that the electronic device 10 supports, and may receive data associated with program execution from the memory device 12 or may transmit a result of the program execution to the memory device 12.

The memory device 12 includes a first memory chip 100, a second memory chip 200, and a substrate 300. The first memory chip 100 may include a memory cell array storing data, and may receive and output data at a first bandwidth. The second memory chip 200 may include a memory cell array storing data, and may receive and output data at a second bandwidth. Here, the first bandwidth and the second bandwidth may be different from each other. The bandwidth (i.e., the memory bandwidth) may be the rate at which data can be read from or stored into the memory chips by the SoC 11. In some embodiments, the memory device 12 may include more than two memory chips.

Referring to FIG. 1, the second memory chip 200 is stacked on the substrate 300, and the first memory chip 100 is stacked on the second memory chip 200. However, in other embodiments, unlike the embodiment of FIG. 1, the first memory chip 100 may be stacked on the substrate 300, and the second memory chip 200 may be stacked on the first memory chip 100. Here, the order in which the first and second memory chips 100 and 200 are stacked on the substrate 300 is not limited to that illustrated in FIG. 1. Also, one of the first and second memory chips 100 and 200 may be stacked on a first or top surface of the substrate 300, and another of the first and second memory chips 100 and 200 may be stacked on a second or bottom surface opposite to the first or top surface. Also, the number of memory chips stacked on the substrate 300 is not limited to that illustrated in FIG. 1.

Referring to FIG. 1, the first and second memory chips 100 and 200 may be electrically connected with the substrate 300 through wires 400. The wires and the first and second memory chips 100 and 200 may be protected by molding resin. Pads for wire bonding may be disposed on one surface of the substrate 300, and solder balls or bumps may be disposed on an opposite surface of the substrate 300. For example, the substrate 300 may be a printed circuit board (PCB), a flexible printed circuit board (FPCB), a ceramic substrate, or an interposer. For example, the first and second memory chips 100 and 200 may be electrically connected with the substrate 300 by flip-chip bonding, solder bumps, conductive vias such as through silicon vias (TSV), and/or a combination thereof.

In embodiments of the inventive concepts, each of the first memory chip 100 and the second memory chip 200 may be a volatile memory chip needing a refresh operation, that is a dynamic random access memory (DRAM) chip. For example, the DRAM chip may be a general-purpose DRAM chip such as for example a double data rate synchronous dynamic random access memory (DDR SDRAM) chip, a DDR2 SDRAM chip, a DDR3 SDRAM chip, a DDR4 SDRAM chip, a DDR5 SDRAM chip, or the like; a DRAM chip for a mobile application such as for example a low power double data rate (LPDDR) SDRAM chip, an LPDDR2 SDRAM chip, an LPDDR3 SDRAM chip, an LPDDR4 SDRAM chip, an LPDDR4X SDRAM chip, an LPDDR5 SDRAM chip, or the like; or a DRAM chip providing high bandwidth such as for example a graphics double data rate (GDDR) synchronous graphics random access memory (SGRAM) chip, a GDDR2 SGRAM chip, a GDDR3 SGRAM chip, a GDDR4 SGRAM chip, a GDDR5 SGRAM chip, a GDDR6 SGRAM chip, a high bandwidth memory (HBM) chip, a HBM2 chip, a HBM3 chip, a WideIO SDRAM chip, or the like.

According to embodiments of the inventive concepts, the first memory chip 100, the second memory chip 200, and the substrate 300 may be included in one package. The type or kind of the first memory chip 100 and the second memory chip 200 stacked in one package may be different from each other, and a bandwidth that the first memory chip 100 provides and a bandwidth that the second memory chip 200 provides may be different from each other.

For example, the first memory chip 100 may be a DRAM chip for a mobile application, and the second memory chip 200 may be a DRAM chip providing a higher bandwidth than the first memory chip 100. The second memory chip 200 may provide a higher bandwidth than the first memory chip 100, and power consumption of the first memory chip 100 may be smaller than power consumption of the second memory chip 200. That is, characteristics of the first and second memory chips 100 and 200 such as capacity, bandwidth, and power consumption may be different from each other.

The type or kind of the first memory chip 100, and the type or kind of the second memory chip 200, are not limited as described above. For example, the first memory chip 100 may be a general-purpose DRAM chip, and the second memory chip 200 may be a DRAM chip providing a higher (or greater) bandwidth than the first memory chip 100. Also, the first and second memory chips 100 and 200 may be DRAM chips for a mobile application. For example, the first memory chip 100 may be an LPDDR4 chip, and the second memory chip 200 may be an LPDDR5 chip, a GDDR6 chip, or the like providing a higher bandwidth than the LPDDR4 chip.

The memory device 12 according to embodiments of the inventive concepts may be manufactured as one package, which includes heterogeneous memory chips instead of homogeneous memory chips. As such, even though the memory device 12 is one package, the memory device 12 may be used for both an application requiring high bandwidth and an application requiring low power consumption.

In embodiments of the inventive concepts, the one package (i.e., the memory device 12) may for example be any of a package on package (PoP), a ball grid array (BGA), a chip scale packages (CSP), a plastic leaded chip carrier (PLCC), a plastic dual in-line package (PDIP), a die in waffle pack, a die in wafer form, a chip on board (COB), a ceramic dual in-line package (CERDIP), a metric quad flat pack (MQFP), a thin quad flat pack (TQFP), a small outline integrated circuit (SOIC), a shrink small outline package (SSOP), a thin small outline package (TSOP), a system in package (SIP), a multi-chip package (MCP), a wafer-level fabricated package (WFP), a wafer-level processed stack package (WSP), or the like. Also, the SoC 11 may be implemented by using various combinations of packages described above.

Transmission paths between the SoC 11 and the memory device 12, that is channels, may be formed in the substrate 13. For example, the channels may include command paths and address paths for controlling the memory device 12, and data input/output paths, between the SoC 11 and the memory device 12. For example, the substrate 13 may be a printed circuit board, a flexible circuit board, a ceramic substrate, or an interposer.

Figure 2:
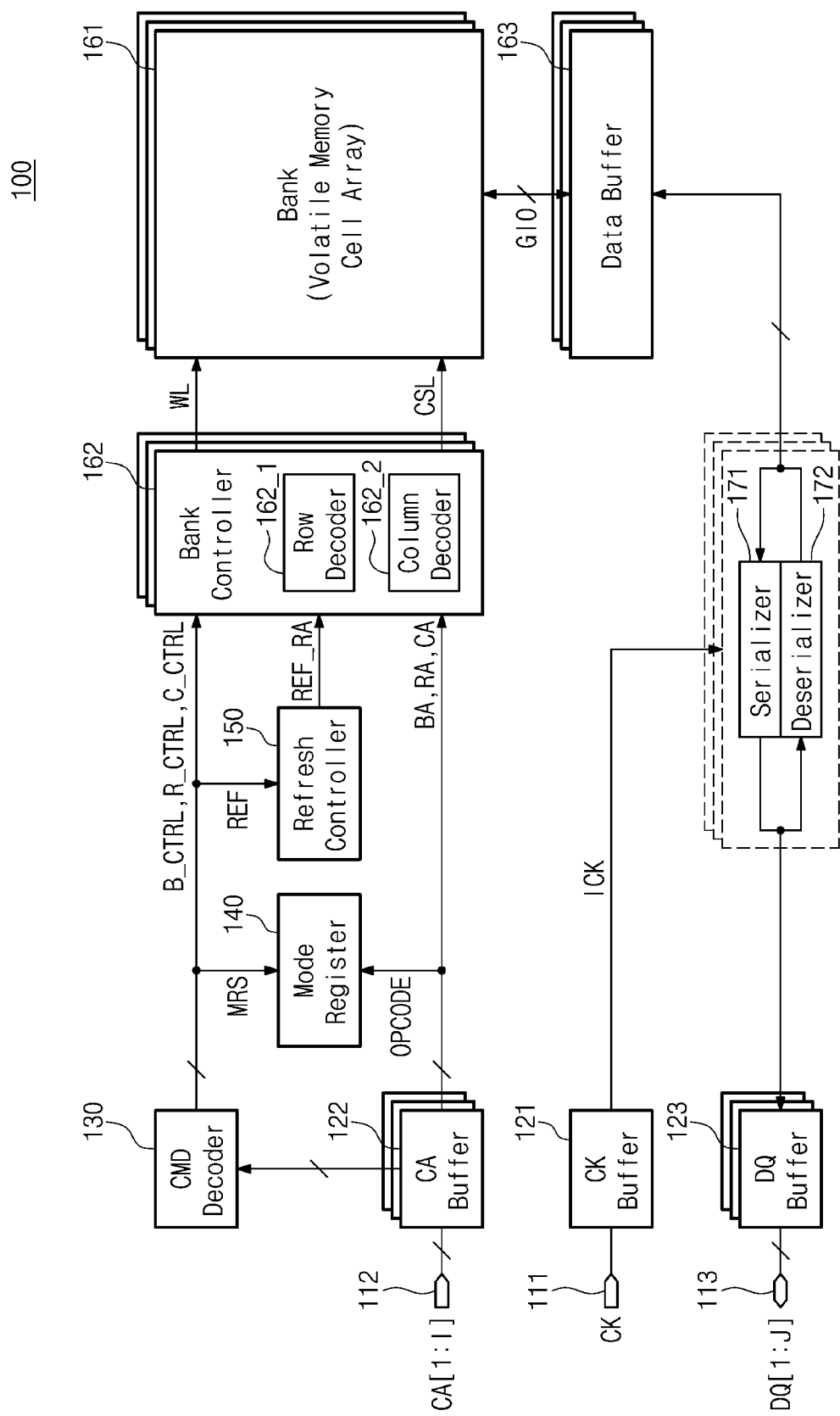
FIG. 2 illustrates a block diagram of a first memory chip of FIG. 1.

FIG. 2 illustrates a block diagram of a first memory chip of FIG. 1. FIG. 2 will be described with reference to FIG. 1. Referring to FIG. 2, the first memory chip 100 includes a clock pin 111, command and address (CA) pins 112, DQ pins 113, a clock buffer 121, a CA buffer 122, a DQ buffer 123, a command decoder 130, a mode register 140, a refresh controller 150, banks 161, bank controllers 162, data buffers 163, a serializer 171, and a deserializer 172.

The clock pin 111 may be a terminal for receiving a clock signal CK from the outside of the first memory chip 100 (e.g., from a host, a memory controller, or the SoC 11 of FIG. 1). The clock signal CK may be a unidirectional signal input to the first memory chip 100, and the clock pin 111 may be an input terminal. For convenience of description, only one clock pin 111 is illustrated in FIG. 2. However, in some embodiments the first memory chip 100 may receive differential clock signals, and the first memory chip 100 may further include another clock pin for receiving a clock signal (e.g., CKb) having a phase opposite to the clock signal CK (e.g., CKa) input through the clock pin 111.

The CA pins 112 may be terminals for receiving CA signals CA[1:I] from the outside of the first memory chip 100. The number of the CA pins 112 and the number of the CA signals CA[1:I] may be "I", that is, may be identical to each other. Here, "I" may be a natural number and may be determined in advance in compliance with various protocols. The CA signals CA[1:I] may include a command for controlling the first memory chip 100 and an address indicating a location of memory cells in the banks 161. The CA signals CA[1:I] may be unidirectional signals input to the first memory chip 100, and the CA pins 112 may be input terminals.

The DQ pins 113 may be terminals receiving DQ signals DQ[1:J] from the outside of the first memory chip 100 or outputting the DQ signals DQ[1:J] to the outside of the first memory chip 100. The number of the DQ pins 113 and the number of the DQ signals DQ[1:J] may be "J", that is, may be identical to each other. Here, "J" may be a natural number and may be determined in advance in compliance with various protocols. The DQ signals DQ[1:J] may include write data for a write command or read data of a read command. The DQ signals DQ[1:J] may be bidirectional signals input to the first memory chip 100 or output from the first memory chip 100, and the DQ pins 113 may be input/output terminals.

In embodiments of the inventive concepts, a transmission rate of the DQ signals DQ[1:J] of the DQ pins 113 may be two times the frequency of the clock signal CK. Here, a unit of the transmission rate is bps (bit per second), and a unit of the frequency is Hz.

A configuration of the first memory chip 100 may be determined depending on "J" (that is the number of the DQ pins 113) and the number of the DQ signals DQ[1:J]. For example, if "J" is 16, the first memory chip 100 may support an x16 mode. However, the first memory chip 100 may further support x4 and x8 modes in addition to the x16 mode. The values of "J" described above are only examples, and "J" may be any value more than 16, such as for example 32, 64, 128, 256, 512, 1024, 2048, etc.

The clock buffer 121 may operate as a receiver (RX) that receives the clock signal CK. The clock buffer 121 may receive the clock signal CK and may output an internal clock signal ICK to the inside of the first memory chip 100. The internal clock signal ICK is illustrated in FIG. 2 as being output only to the serializer 171 and the deserializer 172. However, although not shown, the internal clock signal ICK may also be output to various components of the first memory chip 100. The first memory chip 100 may process a command as an SDRAM based on the clock signal CK input through the clock pin 111.

The CA buffers 122 may operate as receivers that receive the CA signals CA[1:I]. The number of the CA buffers 122 may be identical to the number of the CA pins 112. The CA buffers 122 may sample or latch the CA signals CA[1:I] at rising edges or falling edges of the internal clock signal ICK. The CA buffers 122 may transmit signals, which correspond to the command, of the received CA signals CA[1:I] to a command decoder 130. The CA buffers 122 may transmit signals, which correspond to an operation code OPCODE, of the received CA signals CA[1:I] to the mode register 140 and may transmit signals, which correspond to an address (e.g., a bank address BA, a row address RA and a column address CA), of the received CA signals CA[1:I] to the bank controllers 162. Positions of the command, the operation code OPCODE, and the address included in the CA signals CA[1:I] may be determined in advance in compliance with various protocols.

DQ buffers 123 may include receivers receiving the DQ signals DQ[1:J] and transmitters transmitting the DQ signals DQ[1:J]. Each of the number of receivers and the number of transmitters may be identical to the number of the DQ pins 113. The receivers of the DQ buffers 123 may transmit the received DQ signals DQ[1:J] to the deserializer 172. The transmitters of the DQ buffers 123 may receive the DQ signals DQ[1:J] from the serializer 171 and may output the received DQ signals DQ[1:J] to the outside through the DQ pins 113.

The command decoder 130 may receive the CA signals CA[1:I] from the CA buffers 122. The command decoder 130 may decode signals, which correspond to a command, of the CA signals CA[1:I]. For example, the command decoder 130 may decode an activation command, a write command, a read command, a precharge command, and a mode register set (MRS) command from among various commands and may control components of the first memory chip 100.

The command decoder 130 may transmit a bank control signal B_CTRL, a row control signal R_CTRL, a column control signal C_CTRL, and a refresh control signal REF in response to the activate command, the write command, the read command, the precharge command, the refresh command, etc. The command decoder 130 may also transmit the refresh control signal REF to the refresh controller 150. The command decoder 130 may transmit an MRS signal to the mode register 140 in response to the MRS command. The command decoder 130 may control operations of any other components of the first memory chip 100 in addition to the above-described components.

The mode register 140 may store setting values for various modes of operation that the first memory chip 100 supports. The mode register 140 may include one or more mode registers. For example, the SoC 11 of FIG. 1 may set various modes of operation of the first memory chip 100 by using the setting values stored in the mode register 140. To this end, the SoC 11 may transmit the MRS command and the operation code OPCODE to the first memory chip 100.

For example, the setting of various modes of operation may include operations of setting a burst length, setting a read burst type, setting a column address strobe (CAS) latency, setting delay locked loop (DLL) enable or reset, setting a write recovery (WR) and read to precharge (RTP), setting an additive latency (AL), setting RTT_NOM, RTT_WR, and RTT_PARK, setting impedance control of an output driver, setting write leveling, setting TDQS enable, setting write cyclical redundancy checks (CRC), setting a refresh operation, setting a CAS write latency (CWL), setting a multi-purpose register (MPR), setting a temperature sensor, setting a geardown mode, setting write and read preambles, setting a reference voltage (Vref), setting power-down, setting data bus inversion (DBI), setting data mask, setting on die termination (ODT), setting parity, setting ZQ calibration, and setting various other modes.

The refresh controller 150 may control row decoders of the bank controllers 162 based on the refresh control signal REF. The refresh operation is necessary to retain data stored in the banks 161. The refresh operation may be performed by activating word lines of the banks 161. For example, all memory cells of the banks 161 may be activated at least once during a given time (e.g., 32 ms, 64 ms, etc.).

The refresh controller 150 may transmit a row address REF_RA for a refresh operation to the row decoders of the bank controllers 162. In this case, the row address REF_RA for a refresh operation may be updated whenever a refresh command is input from the outside. Alternatively, in the case where the first memory chip 100 enters a self-refresh mode, the row address REF_RA for a refresh operation may be internally updated every given period without an external refresh command. For the above-described update operations, the refresh controller 150 may include a counter that generates and updates the row address REF_RA for a refresh operation.

In an embodiment, a refresh period may vary with a temperature of the first memory chip 100. Also, a refresh operation of the first memory chip 100 may be performed in a bank unit (i.e., per bank refresh). If the refresh operation of the first memory chip 100 is performed by a bank unit, while any one bank is refreshed, the SoC 11 may access any other banks.

The banks 161 are memory cell arrays including memory cells repeatedly disposed. Memory cells may be disposed at intersections of word lines (not illustrated) and bit lines (not illustrated) of a bank. Here, the memory cells of the banks 161 may be volatile memory cells that need to be refreshed for retaining data stored therein.

The number of the banks 161 may be determined in advance in compliance with various protocols of a memory chip. As the number of the banks 161 becomes greater, memory cells of the first memory chip 100 may be divided into more banks, and the number of banks that the SoC 11 can access may increase.

The bank controllers 162 may control the banks 161 based on the bank control signal B_CTRL, the row control signal R_CTRL, the column control signal C_CTRL, and the refresh control signal REF. In an embodiment, the bank controllers 162 may control respective banks 161. In other embodiments, one bank controller may control two or more banks. In other words, one bank controller may be shared by two or more banks. Each of the bank controllers 162 may include a row decoder 162_1 and a column decoder 162_2.

The row decoder 162_1 may receive the row control signal R_CTRL from the command decoder 130 and the row address RA from the CA buffers 122 and may select a word line WL. Also, the row decoder 162_1 may receive the refresh control signal REF from the command decoder 130 and the row address REF_RA for a refresh operation from the refresh controller 150 and may select a word line WL. For example, to drive word lines of a bank, the row decoder 162_1 may be disposed along a direction in which word lines are disposed at regular intervals.

The column decoder 162_2 may receive the column control signal C_CTRL from the command decoder 130 and the column address CA from the CA buffers 122 and may select a column selection line CSL. Since one or more bit lines (not illustrated) are connected to the column selection line CSL, the bit lines connected to the column selection line CSL may be selected by the column decoder 162_2. For example, to drive bit lines of a bank, the column decoder 162_2 may be disposed along a direction in which column selection lines are disposed at regular intervals. Unlike that as shown in FIG. 2, the word lines and the column selection lines of the banks 161 may intersect to be perpendicular to each other.

The data buffers 163 may transmit write data to the banks 161 through global input/output lines GIO or may receive read data from the banks 161 through the global input/output lines GIO. The number of the data buffers 163 may be identical to the number of the banks 161, and the data buffers 163 may exchange data with the respective banks 161. Here, the number of bits included in the write/read data may be determined in consideration of the number of prefetch bits, a burst length, the number of the DQ pins 113, among other factors.

At least one of the data buffers 163 may be selected by the command decoder 130 depending on the read command or the write command. The number of data buffers that are selected in response to the read command or the write command may be determined, for example, depending on the number of prefetch bits of the first memory chip 100.

A data buffer that is selected depending on the write command may receive write data from the deserializer 172, and the selected data buffer may transmit the write data to selected memory cells. The selected data buffer may drive a global input/output line and the selected memory cells based on the write data.

A data buffer that is selected depending on the read command may receive and store read data output from memory cells selected depending on the read command. To this end, the selected data buffer may sense and amplify a voltage of the global input/output line. The selected data buffer may transmit the read data to the serializer 171.

The serializer 171 may serialize bits of the read data in response to the read command. The deserializer 172 may deserialize bits of the write data in a write operation. For example, the serializer 171 may be implemented to include serializers, the number of which is identical to the number of the DQ signals DQ[1:J], and the deserializer 172 may be implemented to include deserializers, the number of which is identical to the number of the DQ signals DQ[1:J].

In an embodiment, the serializer 171 and the deserializer 172 may operate based on the internal clock signal ICK. The serializer 171 may serialize the read data output from the data buffers 163 and generate the DQ signals DQ[1:J] having a transmission rate (i.e., a double data rate (DDR)) that is two times the frequency of the internal clock signal ICK. The deserializer 172 may deserialize the DQ signals DQ[1:J] having a transmission rate that is two times the frequency of the internal clock signal ICK. That is, the first memory chip 100 may support a DDR mode in which a read operation and a write operation are performed at a transmission rate corresponding to two times the frequency of the clock signal CK.

In an embodiment, although not illustrated in FIG. 2, the first memory chip 100 may further receive a data strobe signal DQS together with the write data. In this case, the first memory chip 100 may further include a pin and a buffer, which are used to receive the data strobe signal DQS. The deserializer 172 may operate based on both the internal clock signal ICK and the data strobe signal DQS. Also, the first memory chip 100 may generate the data strobe signal DQS aligned with the read data serialized by the serializer 171, and the data strobe signal DQS thus generated may be output to the outside of the first memory chip 100 together with the DQ signals DQ[1:J].

Figure 3:
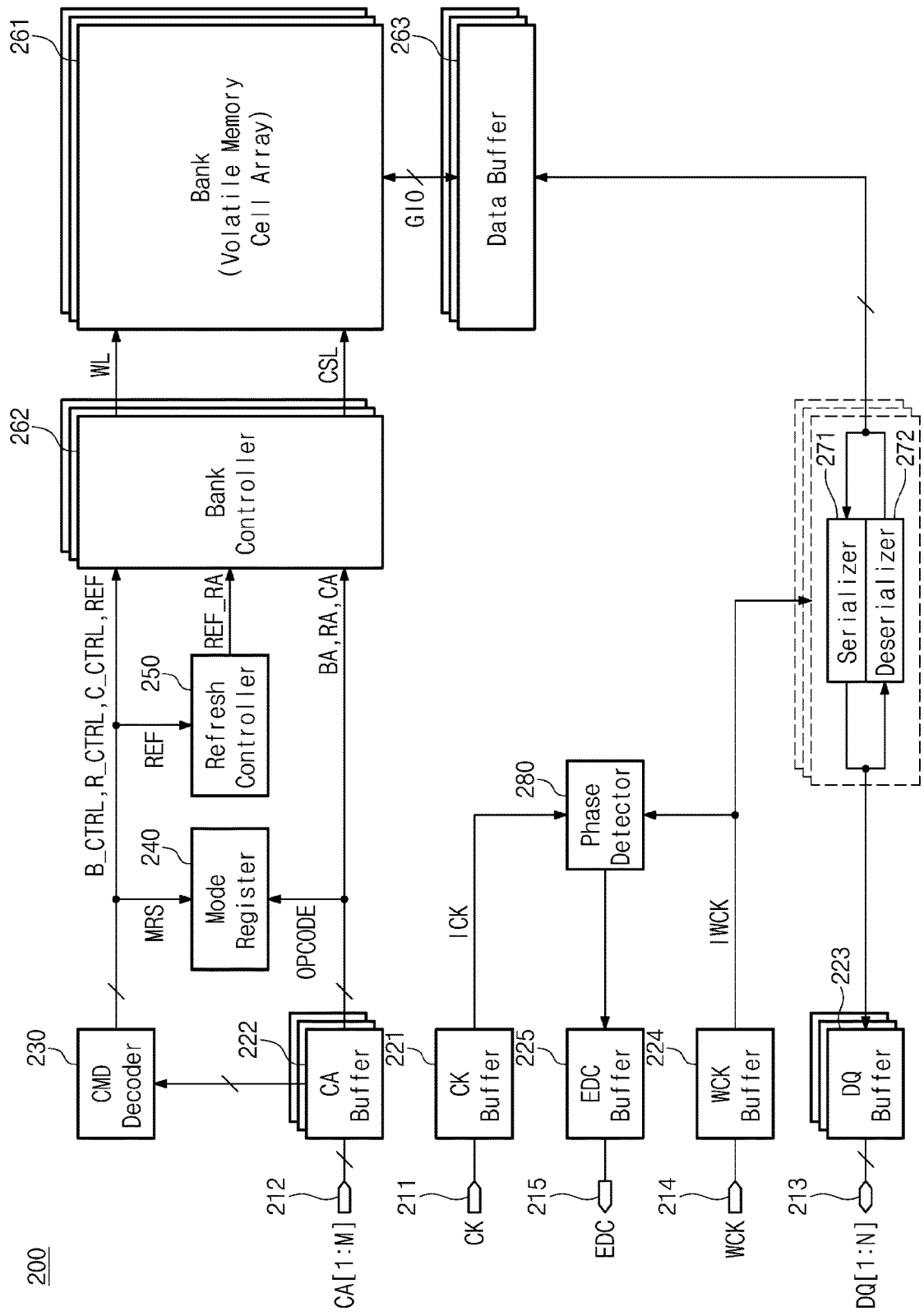
FIG. 3 illustrates a block diagram of a second memory chip of FIG. 1.

FIG. 3 illustrates a block diagram of a second memory chip of FIG. 1. FIG. 3 will be described with reference to FIGS. 1 and 2. Referring to FIG. 3, the second memory chip 200 includes a clock pin 211, CA pins 212, DQ pins 213, a clock buffer 221, CA buffers 222, DQ buffers 223, a command decoder 230, a mode register 240, a refresh controller 250, banks 261, bank controllers 262, data buffers 263, a serializer 271, and a deserializer 272. The above-described components may respectively operate similar and be similar to clock pin 111, CA pins 112, DQ pins 113, clock buffer 121, CA buffers 122, DQ buffers 123, command decoder 130, mode register 140, refresh controller 150, banks 161, bank controllers 162, data buffers 163, serializer 171, and deserializer 172 of the first memory chip 100 of FIG. 2. Hereinafter, description will be given with respect to differences between the first memory chip 100 and the second memory chip 200, and description of the similar components may be omitted.

A bandwidth of the second memory chip 200 may be higher than a bandwidth of the first memory chip 100. For example, a unit of the bandwidth may be giga byte per second (GBps), and the bandwidth may increase as a transmission rate per DQ pin becomes higher.

To provide a higher bandwidth than the bandwidth of the first memory chip 100, the second memory chip 200 may further include a data clock pin 214, a data clock buffer 224, an error detection code (EDC) pin 215, an EDC buffer 225, and a phase detector 280.

The data clock pin 214 may be a terminal for receiving a data clock signal WCK from the outside of the second memory device 200. A frequency of the data clock signal WCK may be higher than the frequency of the clock signal CK.

The data clock signal WCK may be a unidirectional signal input to the second memory chip 200, and the data clock pin 214 may be an input terminal. As described with respect to the clock signal CK, the second memory chip 200 may receive differential clock signals, and thus, the second memory chip 200 may further include a data clock pin for receiving a clock signal (e.g., WCKb) having a phase opposite to the data clock signal WCK (e.g., WCKa) input through the data clock pin 214.

The data clock buffer 224 may operate as a receiver that receives the data clock signal WCK. The data clock buffer 224 may receive the data clock signal WCK and may output an internal data clock signal IWCK to the inside of the second memory chip 200. In detail, to make a transmission rate higher, the data clock buffer 224 may transmit the internal data clock signal IWCK to the serializer 271 and the deserializer 272.

Unlike the serializer 171 and the deserializer 172 of FIG. 2, the serializer 271 and the deserializer 272 may respectively perform a serialization operation and a deserialization operation, based on the internal data clock signal IWCK instead of the clock signal CK.

The second memory chip 200 may generate DQ signal DQ[1:N] having a transmission rate faster than a transmission rate of the DQ signals DQ[1:J] of the first memory chip 100 by using the data clock signal WCK, at the DQ pins 213. For example, the transmission rate of each of the DQ pins 213 may be at least two times the frequency of the data clock signal WCK. The second memory chip 200 may for example support a DDR mode, a quad data rate (QDR) mode, etc. with respect to the frequency of the data clock signal WCK.

To provide alignment between the data clock signal WCK and the clock signal CK, the data clock buffer 224 transmits the internal data clock signal IWCK to the phase detector 280. Before the second memory chip 200 processes a read command or a write command, training (WCK2CK training) between the data clock signal WCK and the clock signal CK may be performed in advance. Through the WCK2CK training, the SoC 11 of FIG. 1 may exactly determine a read latency (RL) and a write latency (WL) of the second memory chip 200, which are based on the clock signal CK.

The phase detector 280 may sample the internal data clock signal IWCK at rising edges or falling edges of the internal clock signal ICK. The number of times that the internal data clock signal IWCK is sampled by the phase detector 280 may be one or more. The phase detector 280 may repeatedly sample the internal data clock signal IWCK to determine whether the internal data clock signal IWCK is early with respect to the internal clock signal ICK or whether the internal data clock signal IWCK is late with respect to the internal clock signal ICK. The phase detector 280 may output an EDC signal indicating a result of the determination to the outside (e.g., the SoC 11) of the second memory chip 200 through the EDC buffer 225 and the EDC pin 215. Here, the EDC buffer 225 may include a transmitter for outputting the EDC signal, and the EDC pin 215 may be an output terminal for outputting the EDC signal.

The EDC signal output to the outside may be used for the WCK2CK training. For example, the SoC 11 may adjust a phase of the data clock signal WCK based on the EDC signal and may reset a phase locked loop (PLL) (not illustrated) or a delay locked loop (DLL) (not illustrated) of the second memory chip 200.

The second memory chip 200 may support a WCK2CK auto synchronization mode between the data clock signal WCK and the clock signal CK. In the auto synchronization mode, a delay of a PLL or a DLL of the second memory chip 200 may be adjusted, and thus, phases of the internal data clock signal IWCK and the internal clock signal ICK may be synchronized with each other.

In other embodiments, the second memory chip 200 may not receive the data clock signal WCK, and may not include the data clock pin 214, the data clock buffer 224, the phase detector 280, the EDC buffer 225, and the EDC pin 215. Instead, to provide high bandwidth, the second memory chip 200 may include the DQ pins 213, the number of which is more than the number of the DQ pins 113 of the first memory chip 100. For example, "N" may be greater than "J".

As the number of the DQ pins 213 increases, the number of bits of data that are exchanged between the SoC 11 and the second memory chip 200 may increase. For example, it is assumed that the burst length (BL) of the first memory chip 100 and the burst length of the second memory chip 200 are identical to each other, that is, 16. In this case, the number of bits included in the DQ signals DQ[1:J] of the first memory chip 100 may be "J×16", and the number of bits included in the DQ signals DQ[1:N] of the second memory chip 200 may be "N×16". As described above, since "N" is greater than "J", the second memory chip 200 may provide a higher bandwidth than the first memory chip 100.

In other embodiments, to provide high bandwidth, the second memory chip 200 may make a transmission rate per DQ pin higher by using the data clock signal WCK and may include the DQ pins 213, the number of which is more than the number of the DQ pins 113 of the first memory chip 100.

Description is above given as the second memory chip 200 provides a higher bandwidth than a bandwidth of the first memory chip 100. However, in some embodiments the second memory chip 200 may provide a shorter latency than a latency of the first memory chip 100, in addition to the high bandwidth. Here, the latency may include tRCD (RAS to CAS delay), tRP (row precharge time), tRAS (row active time), tRC (row cycle time), tRRD (RAS to RAS delay), tRFC (refresh cycle time), tWR (write recovery time), tWTR (write to read delay), CL (CAS latency), tCCD (CAS to CAS delay), RL, WL, etc.

"M" that indicates the number of CA signals CA[1:M], the number of the CA pins 212, and the number of the CA buffers 222 of the second memory chip 200 may be greater than "I" that indicates the number of the CA signals CA[1:I], the number of the CA pins 112, and the number of the CA buffers 122 of the first memory chip 100. Accordingly, the second memory chip 200 may receive more command and address bits during the same time than the first memory chip 100 and may decode a command more quickly than the first memory chip 100.

The bandwidth of the second memory chip 200 may be different from the bandwidth of the first memory chip 100. The latency of the second memory chip 200 may be different from the latency of the first memory chip 100. The capacity of the second memory chip 200 may be different from the capacity of the first memory chip 100. For example, the number of the banks 261 of the second memory chip 200 may be different from the number of the banks 161 of the first memory chip 100, and a capacity of each of the banks 261 may be different from a capacity of each of the banks 161.

The power consumption of the second memory chip 200 may be different from the power consumption of the first memory chip 100. For example, a speed at which volatile memory cells of the banks 261 operate may be higher than a speed at which volatile memory cells of the banks 161 operate. In addition, the amount of current needed to drive volatile memory cells of the banks 161 may be smaller than the amount of current needed to drive volatile memory cells of the banks 261.

Figure 4:
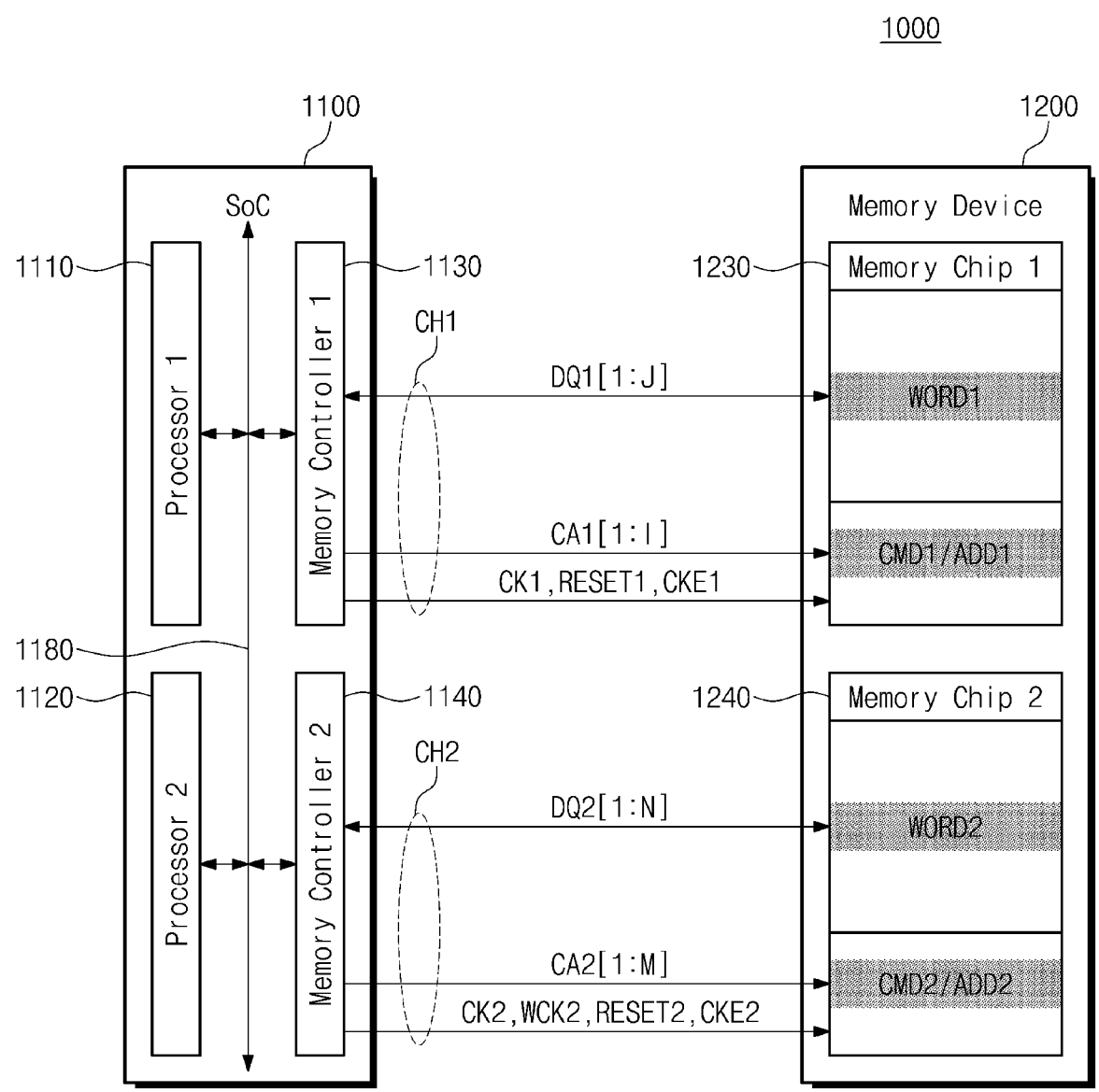
FIG. 4 illustrates a block diagram of an electronic device according to an embodiment of the inventive concepts.

FIG. 4 illustrates a block diagram of an electronic device according to an embodiment of the inventive concepts. An electronic device 1000 includes an SoC 1100 and a memory device 1200. Here, a first memory chip 1230 and a second memory chip 1240 of the memory device 1200 may be the first memory chip 100 and the second memory chip 200 described with reference to FIGS. 1 to 3.

Referring to FIG. 4, the SoC 1100 may communicate with one memory package (i.e., the memory device 1200) through a first channel CH1 and a second channel CH2, which have different bandwidths. The SoC 1100 may include a first processor 1110, a second processor 1120, a first memory controller 1130, and a second memory controller 1140.

For example, the first processor 1110 may include at least one of a central processing unit (CPU), an image signal processing unit (ISP), and a digital signal processing unit (DSP). The second processor 1120 may support applications (e.g., a virtual reality (VR), an augmented reality (AR), a mixed reality (MR), etc.) that are different from applications that the first processor 1110 supports. For example, the amount of computation necessary for an application that the second processor 1120 supports may be greater than the amount of computation necessary for an application that the first processor 1110 supports. Accordingly, the second processor 1120 may communicate with a memory chip that provides a higher bandwidth than a memory chip of the first processor 1110. For example, the second processor 1120 may include at least one of a graphics processing unit (GPU), a vision processing unit (VPU), and a neural processing unit (NPU).

The first memory controller 1130 may provide an interface for performing communication with the first memory chip 1230 through the first channel CH1. Under control of the first processor 1110, the first memory controller 1130 may transmit data provided from the first processor 1110 to the first memory chip 1230 or may transmit data provided from the first memory chip 1230 to the first processor 1110.

For example, the first memory controller 1130 may transmit a first clock signal CK1, a first reset signal RESET1, a first clock enable signal CKE1, and first CA signals CA1[1:I] to the first memory chip 1230 through the first channel CH1. Here, the first reset signal RESET1 may be a signal for resetting the first memory chip 1230, and the first clock enable signal CKE1 may be a signal for determining to activate buffers of the first memory chip 1230 in a power-down mode or a self-refresh mode. In FIG. 4, CMD1/ADD1 may indicate a command and an address included in the first CA signals CA1[1:I].

The first memory controller 1130 may transmit the first DQ signals DQ1[1:J] including write data to the first memory chip 1230 through the first channel CH1. The first memory controller 1130 may receive the first DQ signals DQ1[1:J] including read data from the first memory chip 1230 through the first channel CH1. In FIG. 4, WORD1 may indicate write data or read data of the first memory chip 1230. The first channel CH1 may include transmission paths electrically connected with a clock pin, CA pins, and DQ pins of the first memory chip 1230, and the first channel CH1 may be formed in each of the substrates 300 and 13 described with reference to FIG. 1, for example.

As in the first memory controller 1130, the second memory controller 1140 may control the second memory chip 1240 under control of the second processor 1120. For example, the second memory controller 1140 may transmit a second clock signal CK2, a second reset signal RESET2, a second clock enable signal CKE2, and the second CA signals CA2[1:M] to the second memory chip 1240 through the second channel CH2. To drive the second memory chip 1240 providing a higher bandwidth than the first memory chip 1230, the second memory controller 1140 may further transmit a second data clock signal WCK2 to the second memory chip 1240 through the second channel CH2.

Also, the second memory controller 1140 may transmit the second DQ signals DQ2[1:N] including write data to the second memory chip 1240 through the second channel CH2. The second memory controller 1140 may receive the second DQ signals DQ2[1:N] including read data from the second memory chip 1240 through the second channel CH2. In FIG. 4, WORD2 may indicate write data or read data of the second memory chip 1240. The second channel CH2 may include transmission paths electrically connected with a clock pin, CA pins, and DQ pins of the second memory chip 1240, and the second channel CH2 may be formed in each of the substrates 300 and 13 described with reference to FIG. 1, for example.

In an embodiment, unlike that as shown in FIG. 4, the first memory controller 1130 and the second memory controller 1140 may respectively transmit the same clock signal CK to the first memory chip 1230 and the second memory chip 1240. Alternatively, the first memory controller 1130 and the second memory controller 1140 may transmit one common clock signal CK to the memory device 1200, and the common clock signal CK may be shared by the first memory chip 1230 and the second memory chip 1240.

A bus 1180 may provide a data input/output path between the first processor 1110, the second processor 1120, the first memory controller 1130, and the second memory controller 1140. For example, the bus 1180 may be implemented with, but is not limited to, an advanced microcontroller bus architecture (AMBA), an advanced high-performance bus (AHB), an advanced peripheral bus (APB), an advanced eXtensible interface (AXI), an advanced system bus (ASB), or AXI coherency extensions (ACE), or a combination thereof.

Figure 5:
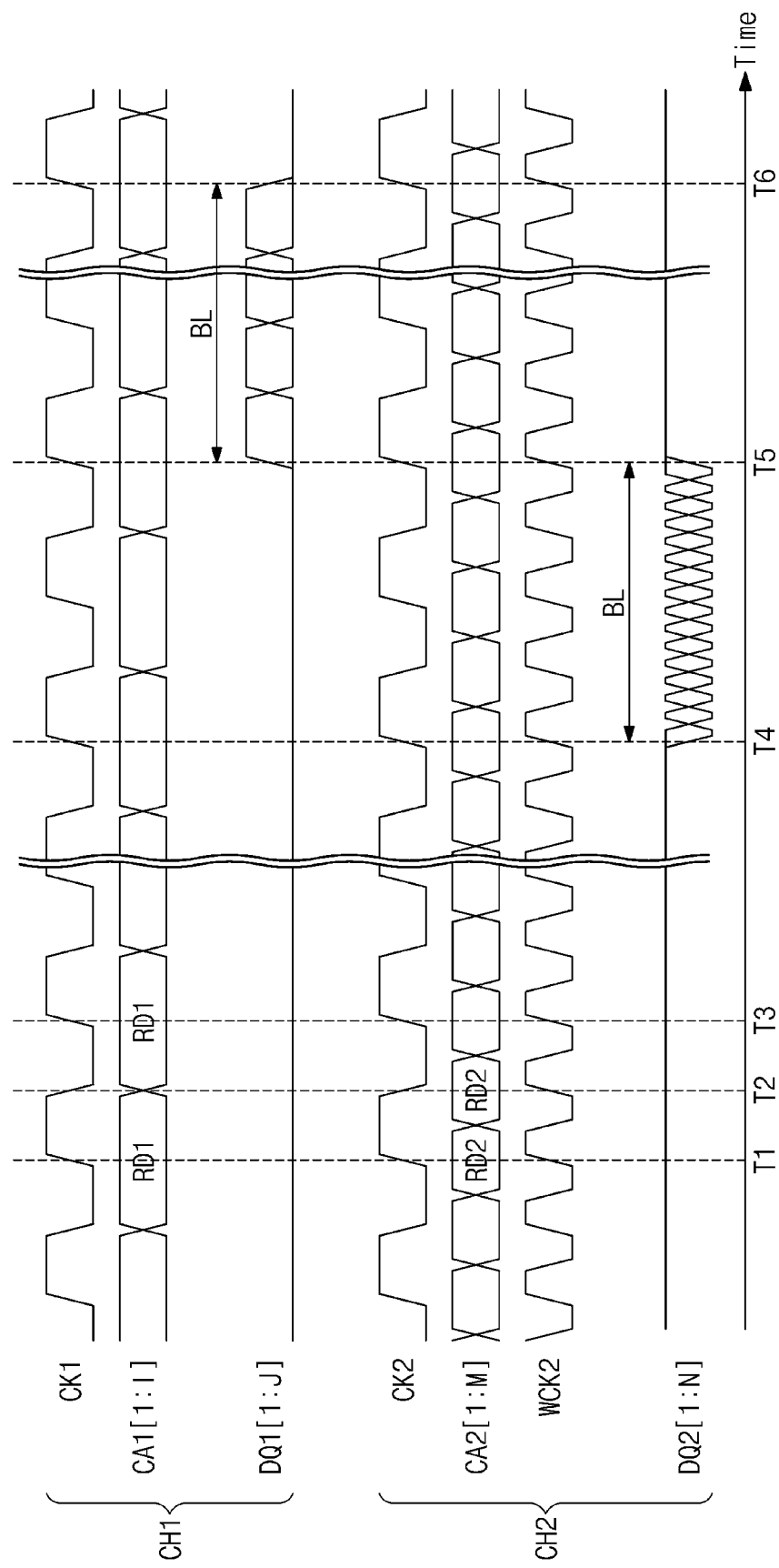
FIG. 5 illustrates a timing diagram of an operation in which a memory device of FIG. 4 processes a read command of a SoC.

FIG. 5 illustrates a timing diagram of an operation in which a memory device of FIG. 4 processes a read command of an SoC. FIG. 5 will be described with reference to FIG. 4.

The first memory controller 1130 may transmit the first clock signal CK1 to the first memory chip 1230 through the first channel CH1, and the second memory controller 1140 may transmit the second clock signal CK2 to the second memory chip 1240 through the second channel CH2. Here, it is assumed that a frequency of the first clock signal CK1 is identical to a frequency of the second clock signal CK2.

The first memory controller 1130 may transmit the first CA signals CA1[1:I] synchronized with the first clock signal CK1 to the first memory chip 1230 through the first channel CH1, and the second memory controller 1140 may transmit the second CA signals CA2[1:M] synchronized with the second clock signal CK2 to the second memory chip 1240 through the second channel CH2. A transmission rate of the first CA signals CA1[1:I] may be identical to a frequency of the first clock signal CK1 (i.e., a single data rate (SDR)). A transmission rate of the second CA signals CA2[1:M] may be identical to two times a frequency of the second clock signal CK2 (i.e., a double data rate (DDR)). For a short latency of the second memory chip 1240, the second memory controller 1140 may generate the second CA signals CA2[1:M] more quickly than the first memory controller 1130.

Compared with the first memory controller 1130, the second memory controller 1140 may further transmit the second data clock signal WCK2 to the second memory chip 1240 through the second channel CH2. In an embodiment, a frequency of the second data clock signal WCK2 may be two times the frequency of the second clock signal CK2.

In FIG. 5, for convenience of description, it is assumed that the first DQ signals DQ1[1:J] are aligned to the first clock signal CK1, the second DQ signals DQ2[1:N] are aligned to the second data clock signal WCK2, and the second data clock signal WCK2 is aligned to the second clock signal CK2. Also, it is assumed that the first memory chip 1230 outputs read data at the DDR mode by using the first clock signal CK1 and the second memory chip 1240 outputs read data at the QDR mode by using the second data clock signal WCK2. In addition, it is assumed that both the first memory chip 1230 and the second memory chip 1240 activate any word lines in response to the activation command before a time point T1.

At the time point T1, the first memory chip 1230 may sample (or latch) the first CA signals CA[1:I] at a rising edge of the first clock signal CK1. As in the first memory chip 1230, at the time point T1 the second memory chip 1240 may sample (or latch) the second CA signals CA2[1:M] at a rising edge of the second clock signal CK2.

At a time point T2, the second memory chip 1240 may sample (or latch) the second CA signals CA2[1:M] at a falling edge of the second clock signal CK2. The second memory chip 1240 may decode the second CA signals CA2[1:M] sampled at the time point T1 and the time point T2 and may check a second read command RD2 and a read address.

At a time point T3, the first memory chip 1230 may sample the first CA signals CA1[1:I] at a rising edge of the first clock signal CK1. The first memory chip 1230 may decode the first CA signals CA1[1:I] sampled at the time point T1 and the time point T3 and may check a first read command RD1 and a read address.

In an embodiment, as described above, the second memory chip 1240 may provide a shorter latency than a latency of the first memory chip 1230. To this end, the second memory chip 1240 may perform a sampling operation at both the rising edge and the falling edge of the second clock signal CK2, thus reducing a time taken to decode the second read command RD2.

To reduce the number of CA pins and CA buffers described above, the first memory chip 1230 and the second memory chip 1240 may repeatedly perform the sampling operation. If the number of the first CA signals CA1[1:I] and the number of the second CA signals CA2[1:M] is sufficiently great, unlike that as shown in FIG. 5, the first memory chip 1230 and the second memory chip 1240 may respectively perform the sampling operation once to check the first read command RD1 and the second read command RD2.

At a time point T4, the second memory chip 1240 may output, to the second memory controller 1140, the second DQ signals DQ2[1:N] including second read data corresponding to the second read command RD2. For convenience of description, a timing diagram associated with one of the second DQ signals DQ2[1:N] is illustrated. Here, an interval between the time point T1 to the fourth time point T4 may be RL of the second memory chip 1240. "RL" may include a time when bits corresponding to read data are prefetched from banks, a time taken to serialize bits, etc.

At a time point T5, the second memory chip 1240 may complete the output of the second read data. Here, it is assumed that the burst length BL of the second memory chip 1240 is 16, but the burst length may be changed by the MRS command. In an embodiment, the second DQ signals DQ2[1:N] may be set to a level corresponding to logic "1" in the remaining period other than a period defined by the time points T4 and T5.

At the time point T5, the first memory chip 1230 may output, to the first memory controller 1130, the first DQ signals DQ1[1:J] including first read data corresponding to the first read command RD1. For convenience of description, a timing diagram associated with one of the first DQ signals DQ1[1:J] is illustrated. Here, an interval between the time point T1 to the fourth time point T5 may be RL of the first memory chip 1230. That is, the RL of the second memory chip 1240 may be shorter than the RL of the first memory chip 1230.

At a time point T6, the first memory chip 1230 may complete the output of the first read data. As in the above description, it is assumed that the burst length BL of the first memory chip 1230 is 16, but the burst length may be changed by the MRS command. In an embodiment, the first DQ signals DQ1[1:J] may be set to a level corresponding to logic "0" in the remaining period other than a period defined by the time points T5 and T6.

It may be understood from FIG. 5 that a speed at which the second DQ signals DQ2[1:N] are transmitted through the second channel CH2 is higher than a speed at which the first DQ signals DQ1[1:J] are transmitted through the first channel CH1. As an example, a bandwidth of the first channel CH1 and a bandwidth of the second channel CH2 are exemplified in the following table 1 for comparison.

TABLE 1

| CH1 (first memory chip x16) | | CH2 (second memory chip x16) | |
| --- | --- | --- | --- |
| CK1 | 1.75 [GHz] | CK2 | 1.75 [GHz] |
| | | WCK2 | 3.5 [GHz] |
| Data rate/pin | 3.5 [Gbps] | Data rate/pin | 14.0 [Gbps] |
| BW/channel | 7.0 [GBps] | BW/channel | 28.0 [GBps] |

Referring to Table 1, a frequency of the first clock signal CK1 and a frequency of the second clock signal CK2 is 1.75 GHz, and a frequency of the second data clock signal WCK2 is 3.5 GHz. Since the first memory chip 1230 outputs read data at the DDR mode by using the first clock signal CK1, a transmission rate per pin is 3.5 Gbps (giga bit per second). In contrast, since the second memory chip 1240 outputs read data at the QDR mode by using the second data clock signal WCK2, a transmission rate per pin is 14.0 Gbps. Assuming that both the first memory chip 1230 and the second memory chip 1240 are a x16 device, the bandwidth of the first memory chip 1230 is 7.0 GBps (giga byte per second), and the bandwidth of the second memory chip 1240 is 28.0 GBps. Since the first memory chip 1230 is assigned to the first channel CH1 and the second memory chip 1240 is assigned to the second channel CH2, the bandwidth of the first memory chip 1230 is a bandwidth of the first channel CH1, and the bandwidth of the second memory chip 1240 is a bandwidth of the second channel CH2. In the exemplification of FIG. 5 and Table 1, the bandwidth of the second memory chip 1240 may be four times the bandwidth of the first memory chip 1230.

In an embodiment, the second memory chip 1240 may output read data at the DDR mode by using the second data clock signal WCK2. In this case, in Table 1, the frequency of the second data clock signal WCK2 may be 7.0 GHz. Even though the second memory chip 1240 operates at the DDR mode, since the frequency of the second data clock signal WCK2 increases two times, the bandwidth of the second memory chip 1240 may not be changed.

In an embodiment, one or more memory chips may be assigned to each of the first channel CH1 and the second channel CH2. In this case, a bandwidth of a channel may increase in proportion to the number of memory chips assigned.

Figure 6:
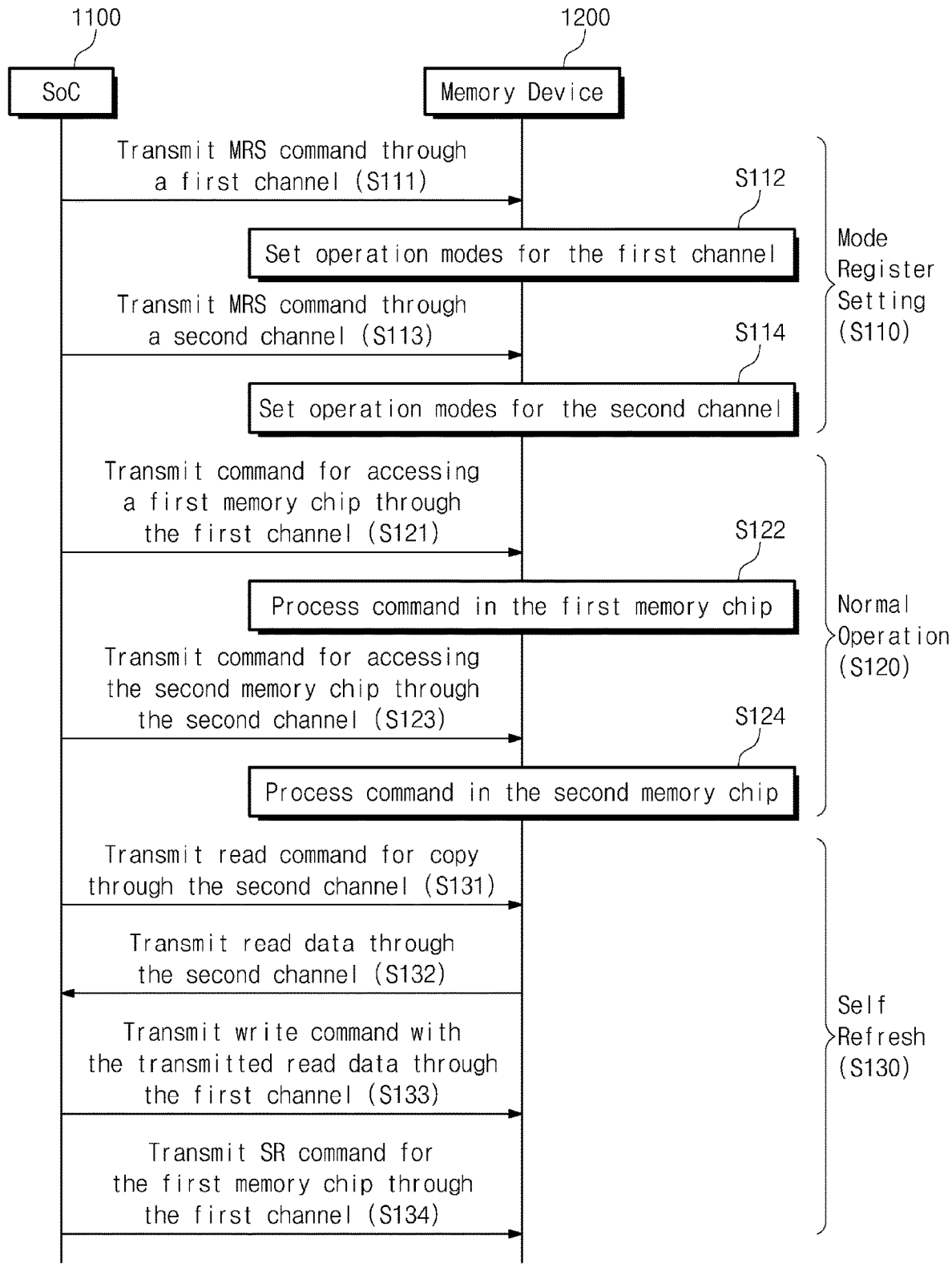
FIG. 6 illustrates a flowchart of an operating method of an electronic device of FIG. 4.

FIG. 6 illustrates a flowchart of an operating method of an electronic device of FIG. 4. FIG. 6 will be described with reference to FIG. 4. The operating method of the electronic device may roughly include a mode register setting phase S110, a normal operation phase S120, and a self-refresh phase S130. However, the order of the phases S110 to S130 is not limited to that illustrated in FIG. 6. For example, entry to the mode register setting phase S110 may be made after the normal operation phase S120, and entry to the self-refresh phase S130 may be made after the mode register setting phase S110.

In operation S111, the SoC 1100 transmits the MRS command to the first memory chip 1230 through the first channel CH1. In operation S112, the first memory chip 1230 sets modes of operation for the first channel CH1 in response to the MRS command. The first memory chip 1230 may update a setting value of a mode register in response to the MRS command.

In operation S113, the SoC 1100 transmits the MRS command to the second memory chip 1240 through the second channel CH2. In operation S114, the second memory chip 1240 sets modes of operation for the second channel CH2 in response to the MRS command. The second memory chip 1240 may update a setting value of a mode register in response to the MRS command.

The order of operation S111 and operation S113 is not limited to that illustrated in FIG. 6. The SoC 1100 may independently transmit the MRS commands to the memory device 1200 through the first and second channels CH1 and CH2.

In operation S121, the SoC 1100 transmits a command for accessing the first memory chip 1230 to the first memory chip 1230 through the first channel CH1. In operation S122, the first memory chip 1230 processes the transmitted command Here, the command may be a command associated with data stored or to be stored in the first memory chip 1230, such as for example an activation command, a read command, a write command, a precharge command, or the like.

In operation S123, the SoC 1100 transmits a command for accessing the second memory chip 1240 to the second memory chip 1240 through the second channel CH2. In operation S124, the second memory chip 1240 processes the transmitted command. Here, the command may be a command associated with data stored or to be stored in the second memory chip 1240. The order of operation S121 and operation S123 is not limited to that illustrated in FIG. 6. The SoC 1100 may independently transmit commands to the memory device 1200 through the first and second channels CH1 and CH2.

In the normal operation phase S120, the SoC 1100 may issue a refresh command for retaining data stored in the memory device 1200. In this case, the memory device 1200 may perform a refresh operation based on the refresh command that the SoC 1100 issues.

However, if the SoC 1100 does not need to access the memory device 1200 during a specific time, the SoC 1100 may issue a self-refresh command to the memory device 1200. In response to the self-refresh command, each of the first memory chip 1230 and the second memory chip 1240 of the memory device 1200 may automatically perform a refresh operation to retain data.

In an embodiment, the bandwidth of the first memory chip 1230 may be lower than the bandwidth of the second memory chip 1240, but power consumption of the first memory chip 1230 may be smaller than power consumption of the second memory chip 1240. Accordingly, the SoC 1100 may copy data stored in the second memory chip 1240 to the first memory chip 1230 and may then transmit the self-refresh command to the first memory chip 1230 through the first channel CH1.

In operation S131, the SoC 1100 transmits a read command for copying data stored in the second memory chip 1240 to the second memory chip 1240 through the second channel CH2. In operation S132, the second memory chip 1240 of the memory device 1200 transmits read data to the SoC 1100 through the second channel CH2 in response to the read command.

In operation S133, the SoC 1100 transmits a write command together with the read data transmitted in operation S132 to the first memory chip 1230 through the first channel CH1. The read data transmitted in operation S132 may be new write data. The first memory chip 1230 of the memory device 1200 may store the new write data, and data stored in the second memory chip 1240 may therefore be copied to the first memory chip 1230.

In operation S134, the SoC 1100 transmits the self-refresh command to the first memory chip 1230 through the first channel CH1. The first memory chip 1230 may retain the data stored before operation S133 and the data copied in operation S133 in response to the self-refresh command.

In an embodiment, before operation S131 is performed, the SoC 1100 may determine whether data stored in the second memory chip 1240 are capable of being stored in the first memory chip 1230, in consideration of data stored in the first memory chip 1230. The SoC 1100 may perform operation S131 to operation S134, based on a result of the determination. That is, if it is determined that data stored in the second memory chip 1240 are capable of being stored in the first memory chip 1230, the SoC 1100 may perform operation S131 to operation S134.

Figure 7:
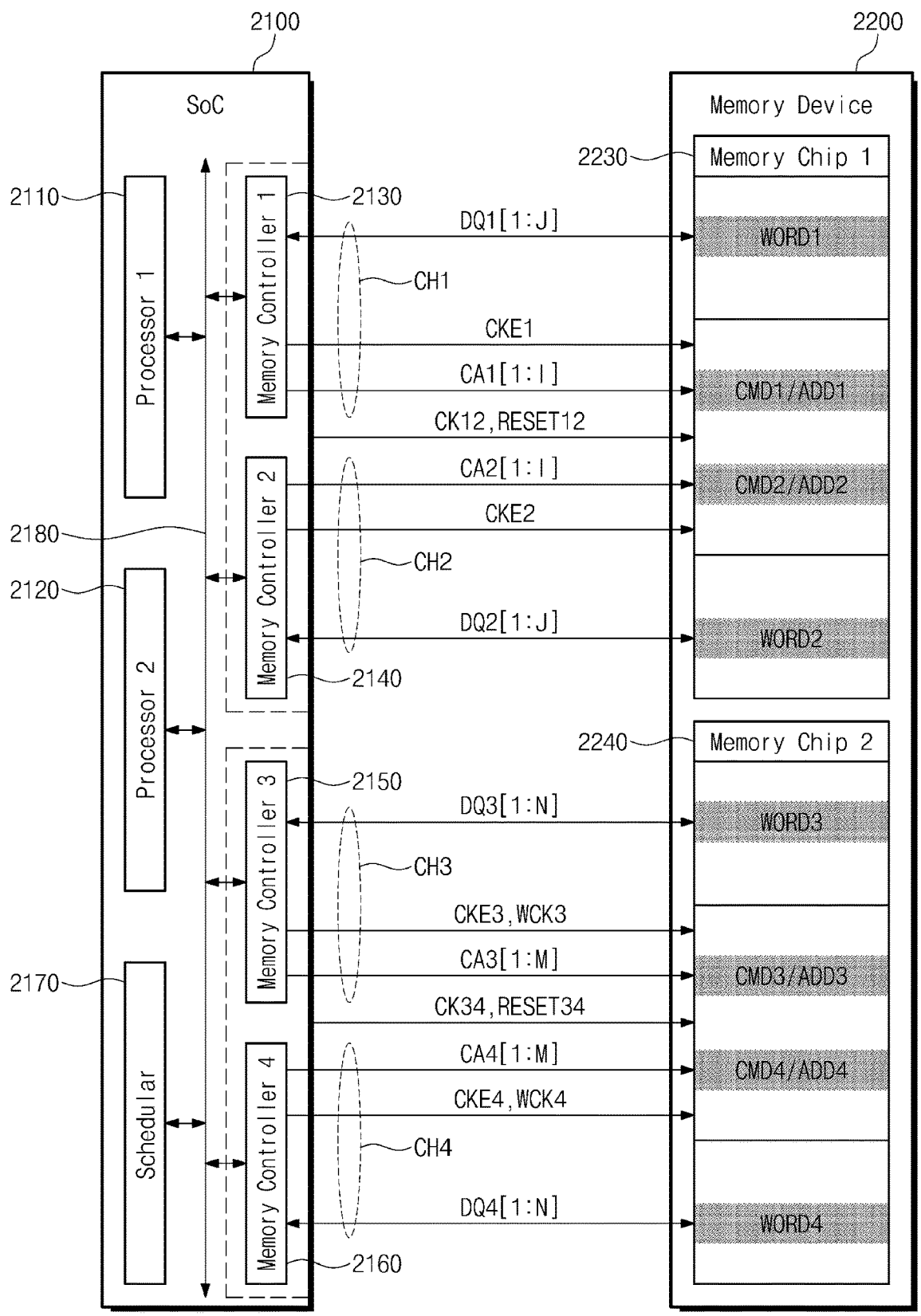
FIG. 7 illustrates a block diagram of an electronic device according to another embodiment of the inventive concepts.

FIG. 7 illustrates a block diagram of an electronic device according to another embodiment of the inventive concepts. FIG. 7 will be described with reference to FIGS. 2 to 4. Description will be given with respect to difference between an electronic device 2000 of FIG. 7 and the electronic device 1000 of FIG. 4, and description of similar components and operation may be omitted from the following for brevity.

Description is given with reference to FIG. 4 as each of the first memory chip 1230 and the second memory chip 1240 supports one channel. However, referring to FIG. 7, a first memory chip 2230 supports a first channel CH1 and a second channel CH2, and a second memory chip 2240 supports a third channel CH3 and a fourth channel CH4. That is, each of the first and second memory chips 2230 and 2240 support one or more channels. Each of the first and second memory chips 2230 and 2240 may further include the above-described components described with reference to FIGS. 2 and 3 depending on the number of channels that each of the first and second memory chips 2230 and 2240 supports.

As a memory device 2200 supports a total of four channels CH1 to CH4, the SoC 2100 includes a first processor 2110, a second processor 2120, first to fourth memory controllers 2130, 2140, 2150 and 2160, a scheduler 2170, and a bus 2180. The first processor 2110, the second processor 2120, and the bus 2180 may respectively operate similar and be similar to the first processor 1110, the second processor 1120, and the bus 1180 of FIG. 4.

The first memory controller 2130 may transmit a first clock enable signal CKE1 and first CA signals CA1[1:I] to the first memory chip 2230 through the first channel CH1. The second memory controller 2140 may transmit a second clock enable signal CKE2 and second CA signals CA2[1:I] to the first memory chip 2230 through the second channel CH2.

The first and second memory controllers 2130 and 2140 may transmit a clock signal CK12 and a reset signal RESET12 to the first memory chip 2230. Like the clock signal CK12 and the reset signal RESET12, signals that are shared by a circuit for the first channel CH1 of the first memory chip 2230 and a circuit for the second channel CH2 of the first memory chip 2230 may not be transmitted through each of the first channel CH1 and the second channel CH2.

The third and fourth memory controllers 2150 and 2160 may communicate with the second memory chip 2240 through the third and fourth channels CH3 and CH4 and may operate similar and be similar to the first and second memory controllers 2130 and 2140.

The third memory controller 2150 may transmit a third clock enable signal CKE3, a third data clock signal WCK3 and third CA signals CA3[1:M] to the second memory chip 2240 through the third channel CH3. The fourth memory controller 2160 may transmit a fourth clock enable signal CKE4, a fourth data clock signal WCK4 and fourth CA signals CA4[1:M] to the second memory chip 2240 through the fourth channel CH4.

The third and fourth memory controllers 2150 and 2160 may transmit a clock signal CK34 and a reset signal RESET34 to the second memory chip 2240. Like the clock signal CK34 and the reset signal RESET34, signals that are shared by a circuit for the third channel CH3 of the second memory chip 2240 and a circuit for the fourth channel CH4 of the second memory chip 2240 may not be transmitted through each of the third channel CH3 and the fourth channel CH4.

The scheduler 2170 may determine an operating order of the first to fourth memory controllers 2130 to 2160 under control of the first and second processors 2110 and 2120. The scheduler 2170 may allow the first and second processors 2110 and 2120 and the first to fourth memory controllers 2130 to 2160 to be connected depending on the determined operating order.

Figure 8:
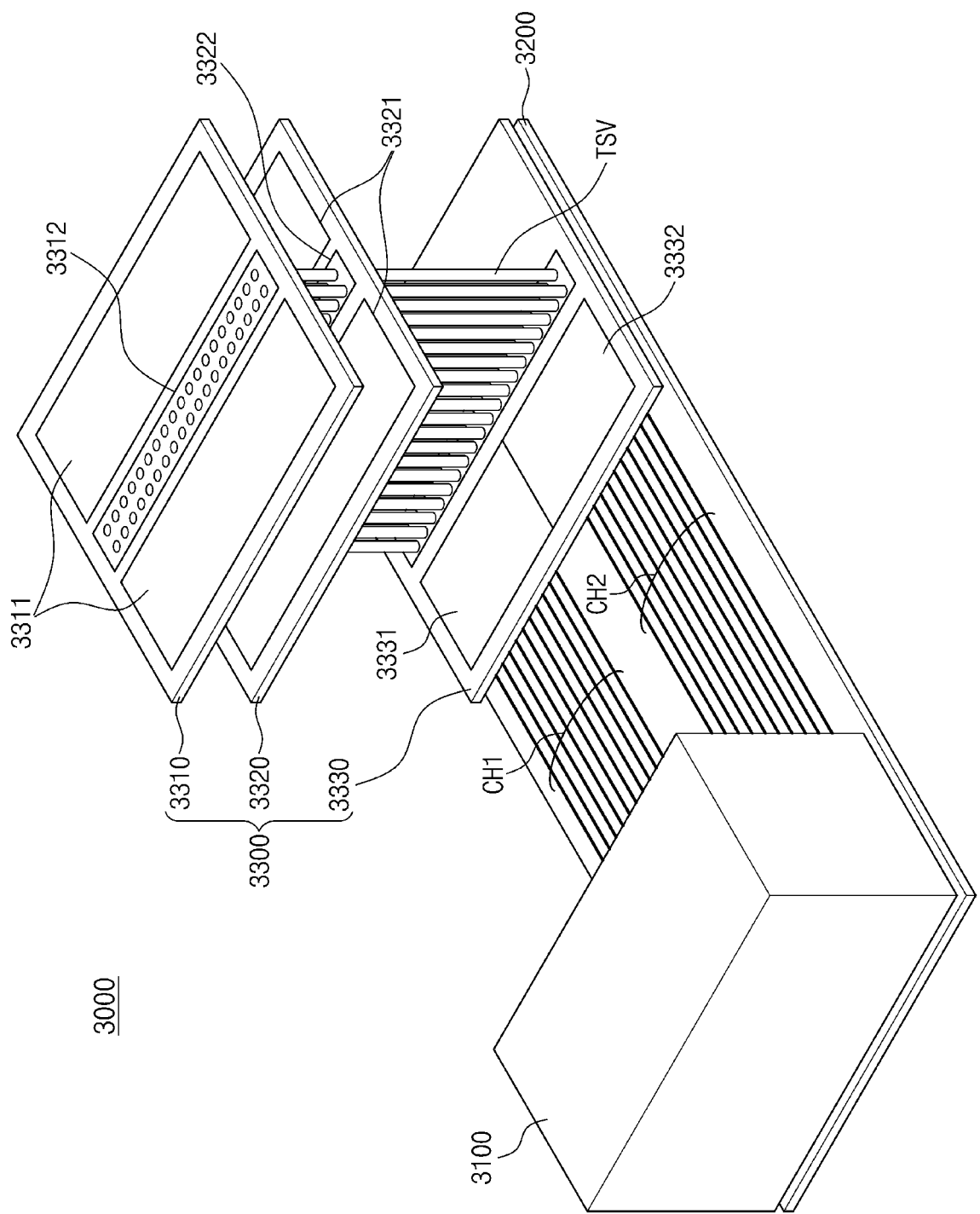
FIG. 8 illustrates a block diagram of an electronic device according to another embodiment of the inventive concepts.

FIG. 8 illustrates a view of an electronic device according to another embodiment of the inventive concepts. FIG. 8 will be described with reference to FIGS. 1 to 3. An electronic device 3000 includes a SoC 3100, a substrate 3200, and a memory device 3300.

The SoC 3100 may be disposed on one surface of the substrate 3200, and solder balls or bumps may be disposed on one surface of the SoC 3100. The SoC 3100 and the substrate 3200 may be electrically connected to each other through the solder balls or the bumps. The SoC 3100 may be the SoC described with reference to FIGS. 1, 4, and 7.

The substrate 3200 may provide an input/output path between the SoC 3100 and the memory device 3300. For example, the substrate 3200 may be a printed circuit board, a flexible printed circuit board, a ceramic substrate, an interposer, or the like. In the case where the substrate 3200 is the interposer, the substrate 3200 may be implemented by using a silicon wafer. A plurality of wires may be implemented within the substrate 3200.

The substrate 3200 may provide wires for the channels described with reference to FIGS. 4 and 7. Referring to FIG. 8, wires forming the first channel CH1 and wires forming the second channel CH2 are illustrated. However, the number of wires illustrated in FIG. 8, the number of wires of the first channel CH1, and the number of wires of the second channel CH2 are only examples. The wires of the substrate 3200 may form three or more channels.

The memory device 3300 may include a plurality of memory dies stacked in a vertical direction. For example, the memory device 3300 may be a high bandwidth memory (HBM) device providing a high bandwidth. The memory device 3300 may be disposed on the one surface of the substrate 3200, on which the SoC 3100 is disposed. Solder balls or bumps may be disposed on one surface of the memory device 3300. The memory device 3300 and the substrate 3200 may be electrically connected to each other through the solder balls or the bumps. The memory device 3300 include a first memory die 3310, a second memory die 3320, a buffer die 3330, and through silicon vias TSV.

The first memory die 3310 and the second memory die 3320 may respectively correspond to the first memory chip 100 of FIG. 2 and the second memory chip 200 of FIG. 3. The first memory die 3310 may include first banks 3311 corresponding to the banks 161 of FIG. 2, first through silicon vias for data input/output of the first banks 3311, and a first TSV area 3312 in which the first through silicon vias are disposed. The second memory die 3320 may include second banks 3321 corresponding to the banks 261 of FIG. 3, second through silicon vias for data input/output of the second banks 3321, and a second TSV area 3322 in which the second through silicon vias are disposed.

Here, the first TSV area 3312 may indicate an area in the first memory die 3310 where through silicon vias for communication between the first memory die 3310 and the buffer die 3330 are disposed. As in the above description, the second TSV area 3322 may indicate an area in the second memory die 3320 where through silicon vias for communication between the second memory die 3320 and the buffer die 3330 are disposed.

The through silicon vias may provide electrical paths between the first and second memory dies 3310 and 3320 and the buffer die 3330. The first and second memory dies 3310 and 3320 and the buffer die 3330 may be electrically connected to each other by the through silicon vias. For example, the number of through silicon vias may be several hundreds to several thousands, and the through silicon vias may be arranged in a matrix form.

In an embodiment, as illustrated in FIG. 8, components (e.g., the remaining components other than the banks 161 of FIG. 2) for accessing the first banks 3311 may be disposed in the buffer die 3330. Also, components (e.g., the remaining components other than the banks 261 of FIG. 3) for accessing the second banks 3321 may be disposed in the buffer die 3330.

The buffer die 3330 may be connected with the first TSV area 3312 and the second TSV area 3322 through the through silicon vias. The buffer die 3330 may receive data from the outside and may transmit the received data to the first and second memory dies 3310 and 3320 through the through silicon vias. The buffer die 3330 may receive data stored in the first and second memory dies 3310 and 3320 through the through silicon vias and may output the received data to the outside.

The buffer die 3330 may include first DQ pins (not illustrated) corresponding to the DQ pins 113 of FIG. 2, a first buffer circuit 3331 driving the first DQ pins and the first memory die 3310, second DQ pins (not illustrated) corresponding to the DQ pins 213 of FIG. 3, and a second buffer circuit 3332 driving the second DQ pins and the second memory die 3320.

The first buffer circuit 3331 may include a circuit for accessing the first banks 3311 and a circuit (i.e., components of the first memory chip 100 of FIG. 2) for driving the first DQ pins. The first buffer circuit 3331 may further include a deserializer (not illustrated) that deserializes data transmitted from the first DQ pins and transmits the deserialized data to the first TSV area 3312 and a serializer (not illustrated) that serializes data transmitted from the first TSV area 3312 and transmits the serialized data to the first DQ pins.

The serializer and the deserializer may be a circuit for reducing the number of DQ signals, the number of which increases as the first and second memory dies 3310 and 3320 are stacked and may be different from the serializers 171 and 271 and the deserializers 172 and 272 described with reference to FIGS. 2 and 3. As in the first buffer circuit 3331, the second buffer circuit 3332 may include a circuit for accessing the second banks 3321, a circuit for driving the second DQ pins, and a serializer and a deserializer for reducing the number of DQ signals.

In FIG. 8, a bandwidth of the second channel CH2 may be higher than a bandwidth of the first channel CH1, and a transmission rate of each of the second DQ pins of the second buffer circuit 3332 may be higher than a transmission rate of each of the first DQ pins of the first buffer circuit 3331. Also, the number of the second DQ pins may be greater than the number of the first DQ pins.

In other embodiments, unlike that shown in FIG. 8, all the components of the first memory chip 100 of FIG. 2 may be disposed in the first memory die 3310, and all the components of the second memory chip 200 of FIG. 3 may be disposed in the second memory die 3320. In this case, the buffer die 3330 may include a circuit that buffers signals transmitted through the first channel CH1 and the second channel CH2 and transmits the buffered signals to the first and second memory dies 3310 and 3320 or that buffers signals transmitted from the first and second memory dies 3310 and 3320 and outputs the buffered signals through the first channel CH1 and the second channel CH2.

In other embodiments, unlike that shown in FIG. 8, the buffer die 3330 may drive the first memory die 3310 and the second memory die 3320, and may operate similar and be similar to the first memory die 3310 or the second memory die 3320 at the same time. The buffer die 3330 may further include banks, and a circuit for driving banks, and the banks included in the buffer die 3330 may be assigned to any channel.

Figure 9:
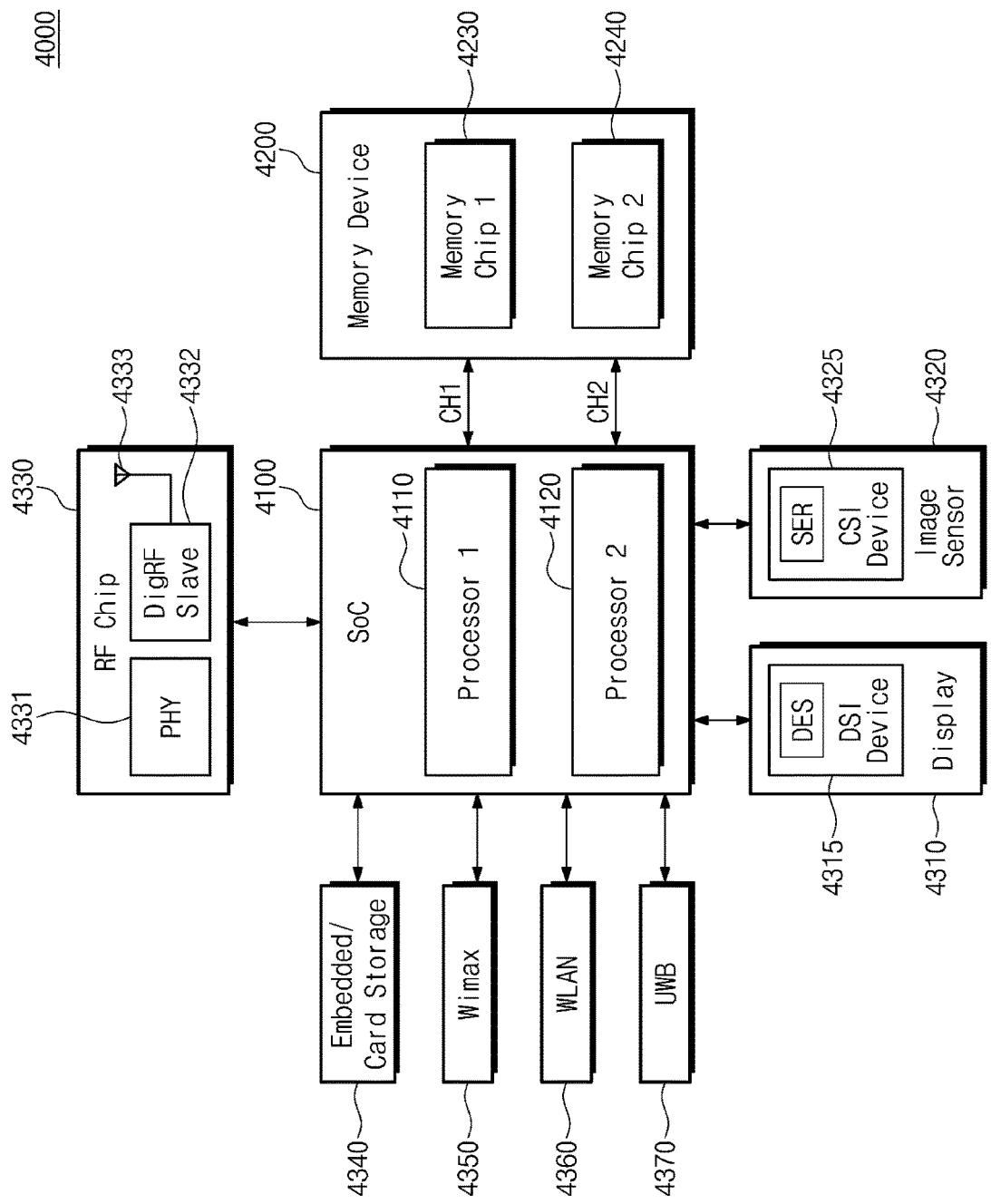
FIG. 9 illustrates a block diagram of an electronic device according to another embodiment of the inventive concepts.

FIG. 9 illustrates a block diagram of an electronic device according to another embodiment of the inventive concepts. An electronic device 4000 may be implemented as capable of using or supporting interfaces proposed by mobile industry processor interface (MIPI®) alliance. For example, the electronic device 4000 may be, but is not limited to, one of a server, a computer, a smartphone, a tablet, a personal digital assistant (PDA), a digital camera, a portable multimedia player (PMP), a wearable device, an Internet of Things (IoT) device, and the like.

The electronic device 4000 includes an SoC 4100 and a memory device 4200. The SoC 4100 includes a first processor 4110 and a second processor 4120, and may be implemented to be substantially the same as the SoCs described with reference to FIGS. 1, 4, 7, and 8. The memory device 4200 include a first memory chip 4230 and a second memory chip 4240, and may be implemented to be substantially the same as the memory devices described with reference to FIGS. 1, 4, 7, and 8.

The electronic device 4000 includes a display 4310 communicating with the SoC 4100. The SoC 4100 may communicate with a display serial interface (DSI) device 4315 through a DSI. For example, an optical deserializer DES may be implemented in the DSI device 4315.

The electronic device 4000 includes an image sensor 4320 communicating with the SoC 4100. The SoC 4100 may communicate with a camera serial interface (CSI) device 4325 through a CSI. For example, an optical serializer SER may be implemented in the CSI device 4325.

The electronic device 4000 further includes a radio frequency (RF) chip 4330 that communicates with the SoC 4100. The RF chip 4330 includes a physical layer 4331, a DigRF slave 4332, and an antenna 4333. For example, the physical layer 4331 of the RF chip 4330 and the SoC 4100 may exchange data with each other through a DigRF interface proposed by the MIPI alliance.

The electronic device 4000 further includes embedded/card storage 4340. The embedded/card storage 4340 may store data provided from the SoC 4100 and may permanently store data provided from the memory device 4200. The electronic device 4000 may for example communicate with an external system through worldwide interoperability for microwave access (WiMAX) 4350, a wireless local area network (WLAN) 4360, ultra wide band (UWB) 4370, and the like.

In addition to the components illustrated in FIG. 9, any other components (e.g., a speaker, a microphone, a GPS, etc.) may be further included in the electronic device 4000. As functions that the electronic device 4000 supports increases, many components should be disposed in the limited area of the electronic device 4000. According to an embodiment of the inventive concepts, the SoC 4100 may communicate with the one memory device 4200 through at least two channels CH1 and CH2, instead of communicating with memory devices, of which the bandwidths and transfer speeds are different from each other. The memory device 4200 may provide memory chips, which have different bandwidths and different transmission rates. Accordingly, the area and costs of the electronic device 4000 may be reduced.

A memory device according to embodiments of the inventive concepts may provide both a memory chip having low power consumption and a memory chip that provides high bandwidth, which are implemented within one package, as connected to and implemented with an SoC. Accordingly, it may be possible to reduce costs for manufacturing the memory device and to increase the efficiency of data input/output between the SoC and the memory device.

While the inventive concepts have been described with reference to exemplary embodiments thereof, it should be apparent to those of ordinary skill in the art that various changes and modifications may be made thereto without departing from the spirit and scope of the inventive concepts as set forth in the following claims.

What is claimed is:

1. A memory device comprising:
a first volatile memory chip comprising a first volatile memory cell array storing first data and configured to receive or output the first data at a first bandwidth; and
a second volatile memory chip comprising a second volatile memory cell array storing second data and configured to receive or output the second data at a second bandwidth different from the first bandwidth,
wherein the first volatile memory chip further comprises:
a first clock pin receiving a first clock;
first CA pins receiving a first command and a first address for the first data in synchronization with the first clock; and
first DQ pins receiving or outputting the first data at a first transmission rate depending on the first command, and
wherein the second volatile memory chip further comprises
a second clock pin receiving a second clock;
second CA pins receiving a second command and a second address for the second data in synchronization with the second clock; and
second DQ pins receiving or outputting the second data at a second transmission rate different from the first transmission rate depending on the second command.

2. The memory device of claim 1, wherein the second bandwidth is higher than the first bandwidth, and
wherein the second transmission rate is higher than the first transmission rate.

3. The memory device of claim 2, wherein the second volatile memory chip further comprises:
a data clock pin receiving a data clock, a frequency of the data clock is higher than a frequency of the second clock.

4. The memory device of claim 3, wherein the first transmission rate is two times the frequency of the first clock, and
wherein the second transmission rate is at least two times the frequency of the data clock.

5. The memory device of claim 1, wherein the second bandwidth is higher than the first bandwidth, and
wherein a number of the second DQ pins is greater than a number of the first DQ pins.

6. The memory device of claim 1, further comprising:
a substrate comprising first transmission paths of a first channel respectively connected with the first clock pin, the first CA pins, and the first DQ pins, and second transmission paths of a second channel respectively connected with the second clock pin, the second CA pins, and the second DQ pins.

7. The memory device of claim 6, wherein the second volatile memory chip is stacked on the substrate, and
wherein the first volatile memory chip is stacked on the second volatile memory chip.

8. A memory device comprising:
a first volatile memory die comprising a first volatile memory cell array storing first data, and first through silicon vias for input/output of the first data;
a second volatile memory die comprising a second volatile memory cell array storing second data, and second through silicon vias for input/output of the second data; and
a buffer die configured to receive the first data through the first through silicon vias and output the first data at a first bandwidth, and to receive the second data through the second through silicon vias and output the second data at a second bandwidth different from the first bandwidth,
wherein the buffer die comprises:
first DQ pins receiving or outputting the first data at a first transmission rate;
second DQ pins receiving or outputting the second data at a second transmission rate;
a first buffer circuit configured to drive the first DQ pins; and
a second buffer circuit configured to drive the second DQ pins.

9. The memory device of claim 8, wherein the second bandwidth is higher than the first bandwidth, and
wherein the second transmission rate is higher than the first transmission rate.

10. The memory device of claim 8, wherein the second bandwidth is higher than the first bandwidth, and
wherein a number of the second DQ pins is greater than a number of the first DQ pins.

11. The memory device of claim 8, wherein the first buffer circuit comprises a first serializer configured to serialize the first data transmitted through the first through silicon vias and transmit the serialized first data to the first DQ pins, and
wherein the second buffer circuit comprises a second serializer configured to serialize the second data transmitted through the second through silicon vias and transmit the serialized second data to the second DQ pins.

12. An electronic device comprising:
a system on chip including a first processor and a second processor; and
a memory device including a first volatile memory chip communicating with the first processor through a first channel, and a second volatile memory chip communicating with the second processor through a second channel,
wherein a first bandwidth of the first channel and a second bandwidth of the second channel are different from each other, and
wherein the first volatile memory chip further comprises:
a first clock pin receiving a first clock;
first CA pins receiving a first command and a first address for first data in synchronization with the first clock; and
first DQ pins receiving or outputting the first data at a first transmission rate depending on the first command, and
wherein the second volatile memory chip further comprises:
a second clock pin receiving a second clock;
second CA pins receiving a second command and a second address for second data in synchronization with the second clock; and
second DQ pins receiving or outputting the second data at a second transmission rate different from the first transmission rate depending on the second command.

13. The electronic device of claim 12, wherein the system on chip further comprises:
- a first memory controller configured to transmit a first clock and a first command synchronized with the first clock to the first volatile memory chip through the first channel under control of the first processor; and
- a second memory controller configured to transmit a second clock and a second command synchronized with the second clock to the second volatile memory chip through the second channel under control of the second processor.

14. The electronic device of claim 13, wherein the system on chip further comprises:
- a scheduler configured to determine an operating order of the first memory controller and the second memory controller.

15. The electronic device of claim 13, wherein the second bandwidth is higher than the first bandwidth, and
wherein the second memory controller further transmits a data clock, a frequency of the data clock is higher than a frequency of the second clock, to the second volatile memory chip through the second channel.

16. The electronic device of claim 15, wherein the system on chip is configured to determine whether data stored in the second volatile memory chip is capable of being stored in the first volatile memory chip.

17. The electronic device of claim 12, wherein the memory device is a memory package in which the first volatile memory chip and the second volatile memory chip are stacked.

* * * * *